(12) United States Patent
Wang et al.

(10) Patent No.: US 10,541,186 B2
(45) Date of Patent: Jan. 21, 2020

(54) CHIP PACKAGE AND CHIP PACKAGING METHOD

(71) Applicant: China Wafer Level CSP Co., Ltd., Suzhou, Jiangsu (CN)

(72) Inventors: Zhiqi Wang, Suzhou (CN); Guoliang Xie, Suzhou (CN); Hanqing Hu, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 6 days.

(21) Appl. No.: 15/950,302

(22) Filed: Apr. 11, 2018

(65) Prior Publication Data
US 2018/0366387 A1    Dec. 20, 2018

(30) Foreign Application Priority Data

Jun. 14, 2017 (CN) .......................... 2017 1 0448280
Jun. 14, 2017 (CN) ..................... 2017 2 0692113 U

(51) Int. Cl.
| | |
|---|---|
| *H01L 23/00* | (2006.01) |
| *H01L 23/31* | (2006.01) |
| *H01L 27/146* | (2006.01) |
| *H01L 21/56* | (2006.01) |
| *H01L 21/78* | (2006.01) |
| *H01L 21/683* | (2006.01) |
| *H01L 21/768* | (2006.01) |

(52) U.S. Cl.
CPC ........ *H01L 23/3114* (2013.01); *H01L 21/561* (2013.01); *H01L 21/565* (2013.01); *H01L 21/568* (2013.01); *H01L 21/6835* (2013.01); *H01L 21/76816* (2013.01); *H01L 21/76877* (2013.01); *H01L 21/78* (2013.01); *H01L 24/06* (2013.01); *H01L 24/96* (2013.01); *H01L 27/14618* (2013.01); *H01L 27/14632* (2013.01); *H01L 27/14636* (2013.01); *H01L 27/14687* (2013.01); *H01L 24/11* (2013.01); *H01L 24/13* (2013.01); *H01L 2221/6834* (2013.01); *H01L 2221/68327* (2013.01); *H01L 2221/68386* (2013.01); *H01L 2224/11002* (2013.01); *H01L 2224/113* (2013.01); *H01L 2224/12105* (2013.01); *H01L 2224/13025* (2013.01); *H01L 2224/95001* (2013.01)

(58) Field of Classification Search
CPC .................... H01L 23/3114; H01L 21/6835
See application file for complete search history.

(56) References Cited

U.S. PATENT DOCUMENTS

2011/0180891 A1* 7/2011 Lin ................... H01L 21/6835
257/432

* cited by examiner

*Primary Examiner* — Elias Ullah
(74) *Attorney, Agent, or Firm* — Wolf, Greenfield & Sacks, P.C.

(57) ABSTRACT

A chip package and a chip packaging method are provided. The package includes: a chip to be packaged, a reinforcing layer and solder bumps. The chip to be packaged includes a first surface and a second surface opposite to each other, the first surface includes a sensing region and first contact pads, and the first contact pads are electrically coupled to the sensing region. The reinforcing layer covers the first surface of the chip to be packaged. The solder bumps are provided on the second surface of the chip to be packaged. The solder bump is electrically connected to the first contact pad and is configured to electrically connect with an external circuit.

13 Claims, 11 Drawing Sheets

CHIP PACKAGE AND CHIP PACKAGING METHOD

CROSS REFERENCE TO RELATED APPLICATION

The present application claims the priority to Chinese Patent Application No. 201710448280.6, titled "CHIP PACKAGE AND CHIP PACKAGING METHOD", filed on Jun. 14, 2017 with the State Intellectual Property Office of the PRC, and Chinese Patent Application No. 201720692113.1, titled "CHIP PACKAGE", filed on Jun. 14, 2017 with the State Intellectual Property Office of the PRC, both of which are incorporated herein by reference in their entireties.

FIELD

The present disclosure relates to the technical field of semiconductor manufacturing, and in particular to a chip package and a chip packaging method.

BACKGROUND

With the continuous development of science and technology, more and more electronic devices are widely used in people's daily life and work and bring great convenience to people's daily life and work, and these electronic devices become indispensable important tools to people currently.

Electronic devices tend to be miniaturized and portable. One main factor that determines miniaturization and portability of an electronic device is a packaging design of a chip in the electronic device. In a conventional chip packaging method, packaging is usually performed by using wire bonding. However, with the rapid development of integrated circuits, a size of a product cannot meet a desired requirement due to a long wire, therefore, a wafer level package (WLP) gradually becomes a more common packaging method instead of the wire bonding package. Wafer level packaging technology is a technology in which a whole wafer is packaged and tested and then the wafer is cut into independent chips, and a size of a packaged chip is exactly the same as that of a die. The wafer level package has the following advantages: multiple wafers can be processed at the same time, thereby leading to a high packaging efficiency; the whole wafer is tested before the wafer is cut, thereby simplifying a test process during packaging and reducing a test cost; and a packaged chip has advantages of being light, small, short and thin.

In the conventional wafer level packaging method, in order to protect a surface of a chip from being damaged and contaminated during a process of packaging the chip, a protection substrate is usually formed on a surface of the wafer to protect the wafer. After the chip is packaged, the protection substrate is to be peeled off, and the packaged wafer is cut finally to obtain multiple single-chip packages.

However, in the conventional technology, since the protection substrate is peeled off from the wafer in advance, the surface of the chip may still be damaged and contaminated during a cutting process or other processes subsequently, and strength of the chip package is weak.

SUMMARY

In order to solve the above problems, a chip package and a chip packaging method are provided according to the present disclosure. A reinforcing layer is formed on a first surface of a chip to be packaged, the surface of the chip to be packaged can be prevented from being damaged and contaminated during a cutting process performed after the protection substrate is removed, and strength of the structure to be packaged can be enhanced due to the reinforcing layer.

In order to achieve the above object, the following solutions are provided according to the present disclosure.

A chip package is provided, which includes:

a chip to be packaged, where the chip to be packaged includes a first surface and a second surface opposite to each other, the first surface includes a sensing region and first contact pads, and the first contact pads are electrically coupled to the sensing region;

a reinforcing layer covering the first surface of the chip to be packaged; and solder bumps provided on the second surface of the chip to be packaged, where the solder bump is electrically connected to the first contact pad and is configured to electrically connect with an external circuit.

Preferably, in the package, hardness of the reinforcing layer may be greater than 6H.

Preferably, in the package, the reinforcing layer may be made of an organic material or an inorganic material.

Preferably, in the package, the chip to be packaged may be a capacitive sensing chip, a dielectric constant of the reinforcing layer may be greater than 3, and the reinforcing layer may be made of an insulating material.

Preferably, in the package, the chip to be packaged may be a photosensitive chip, and the reinforcing layer may be made of a transparent material.

Preferably, in the package, a light transmittance of the reinforcing layer may be greater than 80%.

Preferably, in the package, a thickness of the reinforcing layer may range from 2 μm to 40 μm, inclusive.

Preferably, in the package, the package may further include a strengthening layer provided on a side of the chip to be packaged facing away from the reinforcing layer, and the strengthening layer may be located on the outermost side of the package.

Preferably, in the package, the strengthening layer may be made of a plastic packaging adhesive.

Preferably, in the package, the second surface of the chip to be packaged may be provided with via holes penetrating the chip to be packaged, the via hole may be configured to expose the first contact pad; and the solder bump may be electrically connected to the first contact pad through a rewiring layer provided in the via holes.

Preferably, in the package, the via hole may be a dual-stepped hole configured to expose the first contact pad; and each of the via holes may include: a groove provided on the second surface of the chip to be packaged, where a depth of the groove is less than a thickness of the chip to be packaged; and a through hole located in the groove and penetrating the chip to be packaged, where there is a one-to-one correspondence between the through holes and the first contact pads, and the through hole is configured to expose the corresponding first contact pad.

Preferably, in the package, the via hole may be an inverted trapezoid hole configured to expose the first contact pad, where an aperture of the via hole may gradually increase in a direction from the first surface to the second surface.

Preferably, in the package, the via hole may be a straight hole configured to expose the first contact pad.

Preferably, in the package, a sidewall of the chip to be packaged may include an inclined cutting plane, where the second surface is smaller than the first surface due to the inclined cutting plane, to expose a portion of the first contact pad; and the solder bump may be electrically connected to the first contact pad through a rewiring layer provided on the inclined cutting plane.

A chip packaging method is further provided according to the present disclosure, which includes:

providing a wafer, where the wafer includes multiple chips to be packaged arranged in an array, each of the chips to be packaged includes a first surface and a second surface opposite to each other, the first surface includes a sensing region and first contact pads, the first contact pads are electrically coupled to the sensing region, and first surfaces of the multiple chips to be packaged are located on a same side of the wafer;

forming a reinforcing layer on a surface of the wafer, where the reinforcing layer covers the first surfaces of the multiple chips to be packaged;

laminating and fixing the reinforcing layer to a protection substrate;

forming solder bumps on the other surface of the wafer, where a second surface of each of the chips to be packaged is provided with the solder bump, the solder bump is electrically connected to the first contact pad and is configured to electrically connect with an external circuit;

cutting the wafer and the reinforcing layer with a cutting process, to form packages of the multiple chips to be packaged; and peeling off the protection substrate.

Preferably, in the packaging method, the process of laminating and fixing the reinforcing layer to the protection substrate may include:

laminating and fixing the reinforcing layer to the protection substrate by using a UV adhesive.

Preferably, in the packaging method, before performing the cutting process, the method may further include:

forming a strengthening layer on a side of the wafer facing away from the reinforcing layer, where the strengthening layer is located on the outermost side of the package.

Preferably, in the packaging method, the process of forming the solder bump on the other surface of the wafer may include:

forming via holes penetrating the wafer on the second surface of each of the chips to be packaged, where the via hole is configured to expose the first contact pad;

forming an insulating layer covering the second surface of the chip to be packaged and a sidewall of the via hole, where the insulating layer is configured to expose the first contact pad;

forming a rewiring layer covering a bottom of the via hole and the insulating layer; and forming the solder bumps on a surface of the rewiring layer, where the solder bumps are provided opposite to the sensing region of the chip to be packaged.

Preferably, in the packaging method, the process of forming the via holes penetrating the wafer on the second surface of each of the chips to be packaged may include:

forming double-stepped holes configured to expose the first contact pads on the second surface of the chip to be packaged, where each of the via holes includes: a groove provided on the second surface of the chip to be packaged, where a depth of the groove is less than a thickness of the chip to be packaged; and a through hole located in the groove and penetrating the chip to be packaged, where there is a one-to-one correspondence between the through holes and the first contact pads, and the through hole is configured to expose the corresponding first contact pad.

Preferably, in the packaging method, the process of forming the via holes penetrating the wafer on the second surface of each of the chips to be packaged may include:

forming inverted trapezoid holes configured to expose the first contact pads on the second surface of the chip to be packaged, where an aperture of the via hole gradually increases in a direction from the first surface to the second surface.

Preferably, in the packaging method, the process of forming the via holes penetrating the wafer on the second surface of each of the chips to be packaged may include:

forming straight holes configured to expose the first contact pads on the second surface of the chip to be packaged.

Preferably, in the packaging method, the process of forming the solder bump on the other surface of the wafer may include:

forming an inclined cutting plane on a sidewall of the chip to be packaged, where the second surface is smaller than the first surface due to the inclined cutting plane, to expose the first contact pad;

forming an insulating layer covering the inclined cutting plane and the second surface of the chip to be packaged, where the insulating layer is configured to expose the first contact pads;

forming a rewiring layer covering the first contact pads and the insulating layer; and forming the solder bumps on a surface of the rewiring layer, where the solder bumps are provided opposite to the sensing region of the chip to be packaged.

It can be seen from the above description that with the chip package and the chip packaging method provided by the technical solution of the present disclosure, a reinforcing layer is provided on the first surface of the chip to be packaged, a solder bump is provided on the second surface, and the solder bump is electrically connected to a first contact pad on the first surface, so as to electrically connect with an external circuit. It can be seen that in the technical solution of the present disclosure, a reinforcing layer is formed on the first surface of the chip to be packaged, therefore, the surface of the chip to be packaged can be prevented from being damaged and contaminated during a cutting process performed after the protection substrate is removed, and strength of the structure to be packaged can be enhanced due to the reinforcing layer.

BRIEF DESCRIPTION OF THE DRAWINGS

In order to more clearly describe the technical solution in the embodiments of the present disclosure or the technical solution in the conventional technology, drawings to be used in the embodiments of the present disclosure or in the conventional technology are briefly described hereinafter. It is apparent that the drawings described below show merely the embodiments of the present disclosure, and those skilled in the art may obtain other drawings from the drawings without any creative effort.

DETAILED DESCRIPTION OF EMBODIMENTS

Figure 1:
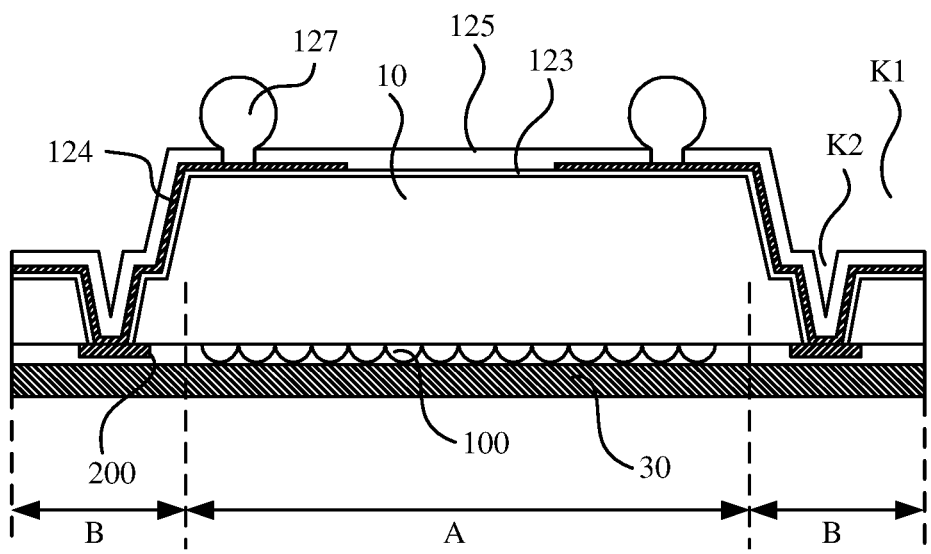
FIG. 1 is a schematic structural diagram showing a chip package according to an embodiment of the present disclosure.

The technical solution in the embodiments of the present disclosure is described clearly and completely hereinafter in conjunction with the accompanying drawings in the embodiments of the present disclosure. Apparently, the described embodiments are merely a part rather than all of embodiments of the present disclosure. All other embodiments obtained by those skilled in the art based on the embodiments of the present disclosure without any creative effort fall within the protection scope of the present disclosure.

It should be noted that these drawings are provided for the purpose of aiding understanding of the embodiments of the present disclosure and should not be construed as limiting the present disclosure. For the sake of clarity, the dimensions shown in the drawings are not drawn to scale and may be enlarged, reduced, or altered in other way. In addition, three-dimensional space sizes of a length, a width and a depth should be included in an actual production. Furthermore, a structure described below that a first feature is "on" a second feature may include an embodiment in which the first feature and the second feature are in direct contact and may further include an embodiment in which an additional feature is formed between the first feature and the second feature, and in the latter case, the first and second features may not be in direct contact.

To make the foregoing objects, features and advantages of the present disclosure clearer and more comprehensible, the present disclosure is further described in detail below in conjunction with the accompanying drawings and specific embodiments.

Reference is made to FIG. 1, which is a schematic structural diagram showing a chip package according to an embodiment of the present disclosure. The package includes: a chip to be packaged 10 including a first surface and a second surface opposite to each other; a reinforcing layer 30 covering the first surface of the chip to be packaged 10; and solder bumps 127 provided on the second surface of the chip to be packaged.

The first surface includes a sensing region A and first contact pads 200, and the first contact pads 200 are electrically coupled to the sensing region A. The first contact pads 200 are provided in a packaging region B surrounding the sensing region A. The solder bump 127 is electrically connected to the first contact pad 200 and is configured to electrically connect with an external circuit.

Hardness of the reinforcing layer 30 is greater than 6H. In the package according to the embodiment of the present disclosure, the reinforcing layer 30 with hardness greater than 6H is provided on the first surface of the chip to be packaged 10, so that the package has high hardness and great mechanical strength.

The reinforcing layer 30 may be made of an organic material or an inorganic material. For example, the reinforcing layer 30 may be made of a hardened silica gel. A cured silica gel has good temperature resistance, weather resistance and electrical insulation property, thereby ensuring that the package has a long service life.

The sensing region of the chip to be packaged 10 is provided with multiple pixels 100 arranged in an array. The chip to be packaged 10 may be a capacitive sensing chip, for example, a fingerprint identification chip. In this case, a dielectric constant of the reinforcing layer 30 is greater than 3, the reinforcing layer 30 is made of an insulating material, and fingerprint information is identified in response to a change in capacitance caused by a finger touch. In this way, when the finger touches the reinforcing layer 30 on the surface of the sensing region A, the pixel 100 is used to identify the fingerprint information in response to the change in capacitance.

In other embodiments, the chip to be packaged 10 may also be a photosensitive chip. In this case, in order to facilitate sensing light by the pixel 100, the reinforcing layer 30 may be made of a transparent material. In this case, the chip to be packaged 10 may be an image sensing chip. The pixel 100 is used to sense incident light through the transparent reinforcing layer 30, and generate image information based on the optical information. In the case where the chip to be packaged 10 is a photosensitive chip, a light transmittance of the reinforcing layer 30 is set to be greater than 80% in order to ensure imaging quality.

In order to ensure a good sealing effect of the reinforcing layer, a thickness of the reinforcing layer 30 is set to range from 2 μm to 40 μm, inclusive, to effectively isolate water vapor and protect the pixel 100.

Generally, in order to obtain a thin package, the second surface of the chip to be packaged 10 is thinned when the chip to be packaged 10 is packaged. Specifically, the second surface of the chip to be packaged 10 may be thinned with mechanical grinding, chemical etching or other ways. However, mechanical strength of the thinned chip to be packaged 10 is weak. In order to further enhance the mechanical strength of the package, the package further includes a strengthening layer provided on a side of the chip to be packaged 10 facing away from the reinforcing layer 30, and the strengthening layer is located on the outermost side of the package. The strengthening layer is not shown in FIG. 1.

In the package according to the embodiment of the present disclosure, the mechanical strength of the strengthening layer is greater than strength of a substrate of the chip to be packaged 10. The thickness of the chip to be packaged 10 can be further reduced with the thinning process and the mechanical strength can be enhanced by the strengthening layer. Therefore, the thickness of the chip to be packaged 10 can be reduced while good mechanical strength of the package is ensured. That is, compared with the package in the conventional technology, in the package according to the embodiment of the present disclosure, the thickness of the chip to be packaged 10 can be further reduced with the thinning process, so that the thickness of the chip to be packaged 10 is smaller, and the mechanical strength of the thinned chip to be packaged is compensated by a strengthening layer with better mechanical strength. Therefore, the thin and light package is implemented. Optionally, the strengthening layer may be made of a plastic packaging adhesive.

The second surface of the chip to be packaged 10 is provided with via holes penetrating the chip to be packaged 10, and the via holes are configured to expose the first contact pads 200, so that the solder bump 127 can be electrically connected to the first contact pad 200.

In the embodiment shown in FIG. 1, the via hole is a double-stepped via hole. In this case, each of the via holes includes a groove K1 provided on the second surface of the chip to be packaged 10 and a through hole K2 located in the groove K1 and penetrating the chip to be packaged 10. A depth of the groove K1 is smaller than a thickness of the chip to be packaged 10 and the groove K1 does not penetrate the chip to be packaged 10. A through hole K2 is formed on the basis of the groove K1, and the through hole K2 penetrates the chip to be packaged 10 to expose the first contact pad 200. There is a one-to-one correspondence between the through holes K2 and the first contact pads 200, and the through hole K2 is configured to expose the corresponding first contact pad 200.

As shown in FIG. 1, the solder bump 127 is electrically connected to the first contact pad 200 through a rewiring layer 124 provided in the via holes.

An insulating layer 123 is further provided between the rewiring layer 124 and the chip to be packaged 10. The insulating layer 123 covers a sidewall of the via hole and exposes a bottom of the via hole, such that the rewiring layer 124 is electrically connected to the first contact pad 200. The rewiring layer 124 covers the bottom of the via hole and the insulating layer 123. The solder bump 127 is located on the surface of the insulating layer 123. Specifically, a solder mask 125 is further provided on the surface of the rewiring layer 124. A surface of the solder mask 125 is provided with openings to accommodate the solder bumps 127, such that the solder bump 127 is electrically connected to the rewiring layer 124 at the opening.

Figure 2:
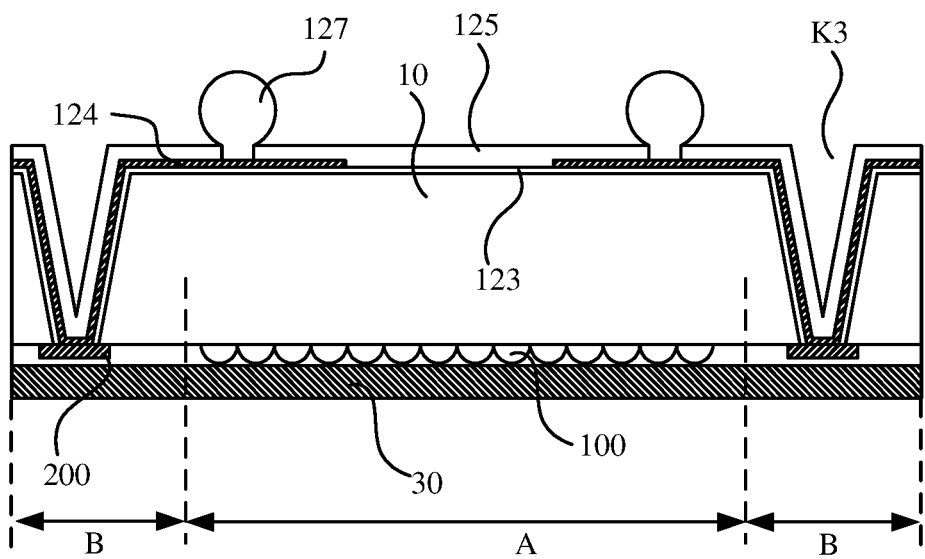
FIG. 2 is a schematic structural diagram showing another chip package according to an embodiment of the present disclosure.

Reference is made to FIG. 2, which is a schematic structural diagram showing another chip package according to an embodiment of the present disclosure. The package shown in FIG. 2 differs from the package shown in FIG. 1 in that in the package shown in FIG. 2, the via hole is an inverted trapezoid hole K3 configured to expose the first contact pad 200. An opening of the inverted trapezoid hole K3 is larger than a bottom surface of the inverted trapezoid hole K3. In a direction perpendicular to the chip to be packaged 10, a cutting plane of the via hole is an inverted trapezoid. In this case, an aperture of the via hole gradually increases in a direction from the first surface to the second surface. The via hole may be a truncated cone or a frustum of a prism.

Figure 3:
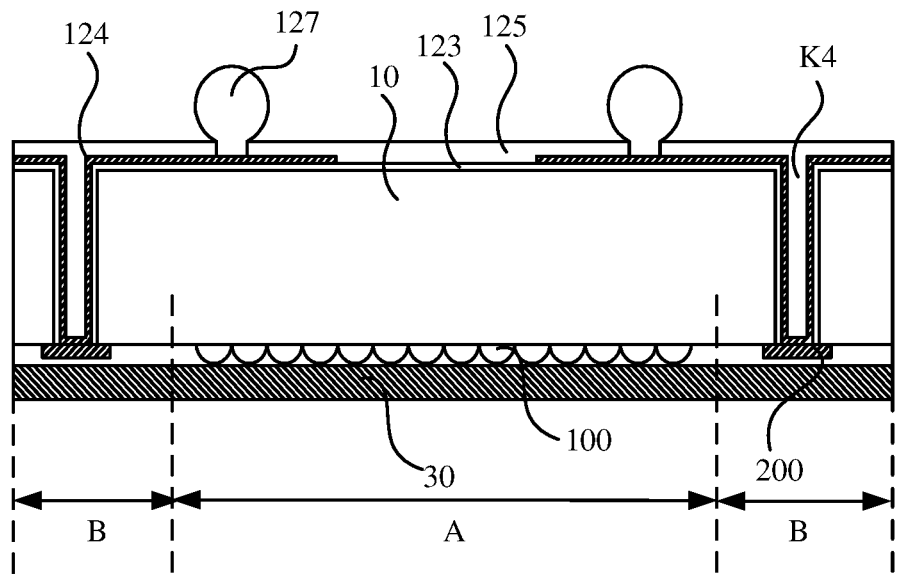
FIG. 3 is a schematic structural diagram showing another chip package according to an embodiment of the present disclosure.

Reference is made to FIG. 3, which is a schematic structural diagram showing another chip package according to an embodiment of the present disclosure. The package shown in FIG. 3 differs from the package shown in FIG. 1 in that in the package shown in FIG. 3, the via hole is a straight hole K4 configured to expose the first contact pad 200. In the direction perpendicular to the chip to be packaged 10, the via hole is the straight hole K4, that is, a cutting plane of the vial hole is a rectangle. Specifically, the straight hole K4 may be a cylindrical via hole or a prismatic via hole. In this case, an aperture of the via hole remains unchanged in the direction from the first surface to the second surface. The via hole may be a round hole, a triangular hole, a square hole or the like.

In the packages shown in FIG. 1 to FIG. 3, the first contact pad 200 is exposed through a via hole, such that the solder bump 127 is electrically connected to the first contact pad 200 through the rewiring layer 124. In other embodiments, the solder bump 127 may be electrically connected to the first contact pad 200 without a via hole, as shown in FIG. 4.

Figure 4:
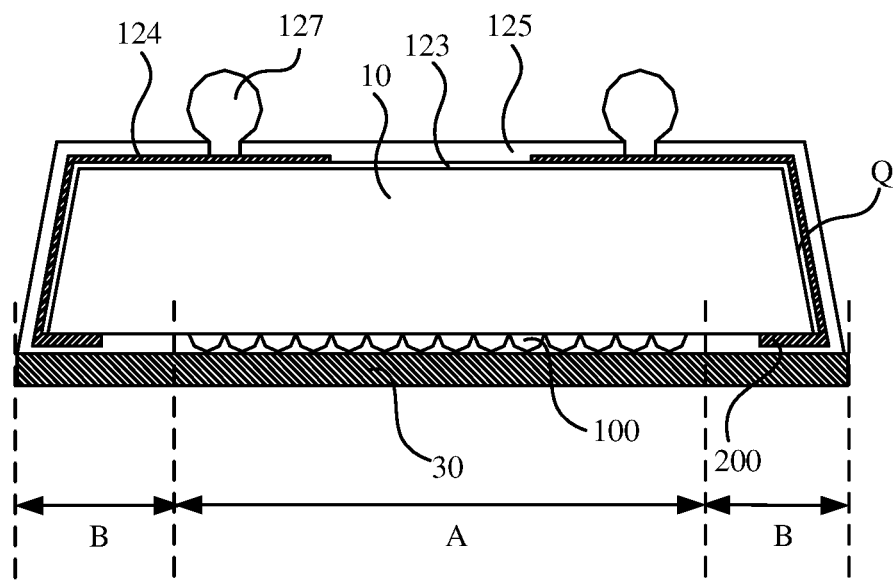
FIG. 4 is a schematic structural diagram showing another chip package according to an embodiment of the present disclosure.

Reference is made to FIG. 4, which is a schematic structural diagram showing another chip package according to an embodiment of the present disclosure. The package shown in FIG. 4 differs from the package shown in FIG. 1 in that in the package shown in FIG. 4, a sidewall of the chip to be packaged 10 includes an inclined cutting plane Q, and the second surface is smaller than the first surface due to the inclined cutting plane Q, to expose a portion of the first contact pad 200. The solder bump 127 is electrically connected to the first contact pad 200 through the rewiring layer 124 provided on the inclined cutting plane Q. In the direction perpendicular to the chip to be packaged 10, the sidewall of the chip to be packaged 10 includes an inclined cutting plane Q. The inclined cutting plane Q may be formed by etching, laser cutting, or mechanical grinding.

It can be seen from the above description that in the package according to the embodiment of the present disclosure, the reinforcing layer 30 is provided on the first surface of the chip to be packaged 10, the solder bumps 127 are provided on the second surface, and the solder bump 127 is electrically connected to the first contact pad 200 on the first surface so as to electrically connect with an external circuit. During a process of forming the package, the reinforcing layer 30 is provided on the first surface of the chip to be packaged 10, therefore, the surface of the chip to be packaged 10 can be prevented from being damaged and contaminated during the cutting process performed after the protection substrate is removed, and the strength of the structure to be packaged can be enhanced due to the reinforcing layer 30.

Figure 5:
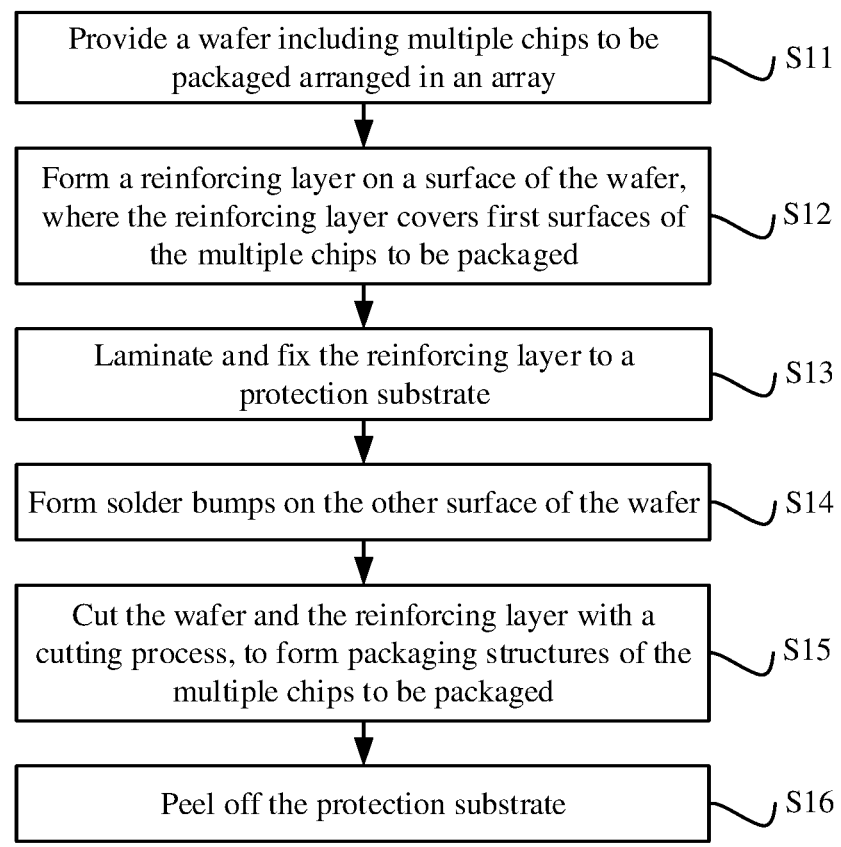
FIG. 5 is a schematic flowchart showing a packaging method according to an embodiment of the present disclosure.

Based on the package described in the above-described embodiment, a packaging method is further provided according to another embodiment of the present disclosure, as shown in FIG. 5. FIG. 5 is a schematic flowchart showing a packaging method according to an embodiment of the present disclosure. The package described in the above-described embodiment can be formed with the packaging method, and the packaging method includes the following step S11 to step S16.

Figure 6:
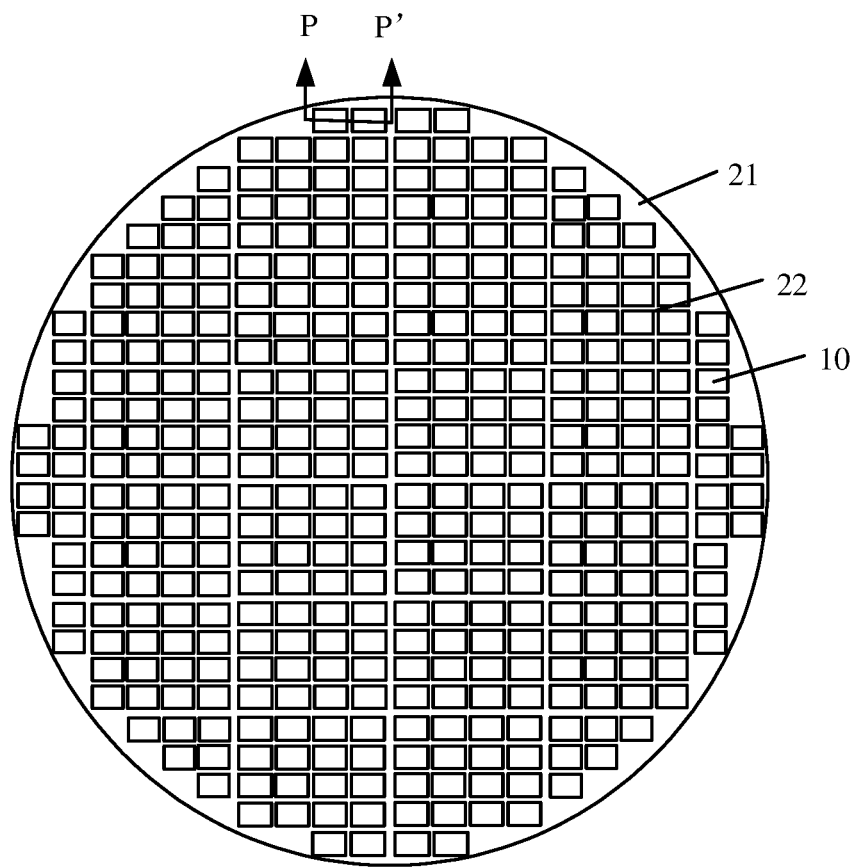
FIG. 6 to FIG. 14b are schematic diagrams showing a process principle of a packaging method according to an embodiment of the present disclosure.
Figure 7:
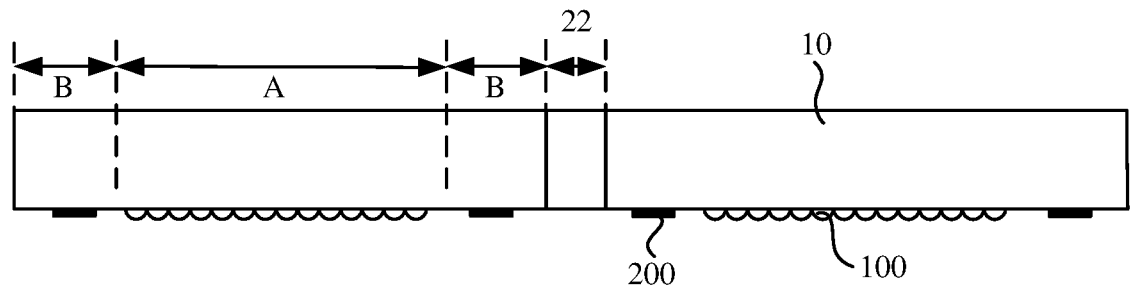

In step S11, as shown in FIG. 6 and FIG. 7, a wafer 21 is provided. The wafer includes multiple chips to be packaged 10 arranged in an array.

FIG. 7 is a sectional view of the wafer shown in FIG. 6 in the PP' direction. The wafer 21 includes a first surface and a second surface opposite to each other. The wafer 21 includes multiple chips to be packaged 10 arranged in an array. Each of the chips to be packaged 10 includes multiple pixels 100. The pixels 100 are located on the first surface. A cutting trench 22 is provided between adjacent chips to be packaged 10 so as to facilitate performing cutting in the subsequent cutting process.

Each of the chips to be packaged 10 includes a first surface and a second surface opposite to each other. The first surface includes a sensing region A and a packaging region B surrounding the sensing region A. The packaging region B includes first contact pads 200 for circuit interconnection, and the first contact pads 200 are electrically coupled to the sensing region A. The first surfaces of all the chips to be packaged are located on a same side of the wafer 21. In the embodiment of the present disclosure, the first contact pad 200 being electrically coupled to the sensing region A indicates that the first contact pad 200 is electrically connected to multiple electrical devices in the sensing region A.

Figure 8:
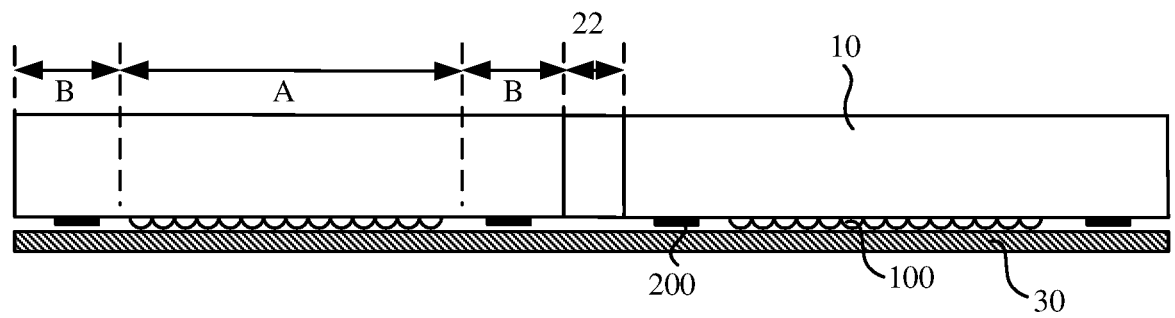

In step S12, as shown in FIG. 8, a reinforcing layer 30 is formed on a surface of the wafer 21. The reinforcing layer 30 covers the first surfaces of all the chips to be packaged 10.

The reinforcing layer 30 may be formed with a molding process in a semiconductor packaging process.

Figure 9:
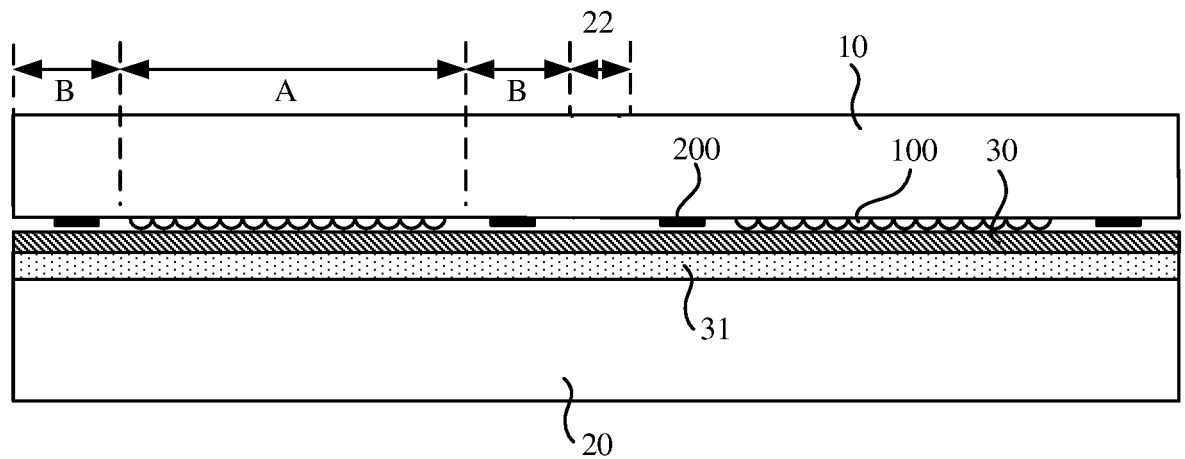

In step S13, as shown in FIG. 9, the reinforcing layer 30 is laminated and fixed to a protection substrate 20.

In step S13, the process of laminating and fixing the reinforcing layer 30 to the protection substrate 20 includes: laminating and fixing the reinforcing layer 30 to the protection substrate 20 by using a UV adhesive 31, where the UV adhesive 31 can be peeled off from the reinforcing layer 30 subsequently. The reinforcing layer 30 is fixed to the protection substrate by using the UV adhesive 31 with UV light sensitivity as a temporary bonding layer. In a case where the UV light irradiates the UV adhesive 31 through the protection substrate 20, the UV adhesive 31 loses viscosity so that the reinforcing layer 30 is separated from the protection substrate 20.

In step S14, solder bumps are formed on the other surface of the wafer.

The second surface of each of the chips to be packaged is provided with a solder bump, and the solder bump is electrically connected to the first contact pad and is configured to electrically connect with an external circuit.

In step S14, the process of forming the solder bumps on the other surface of the wafer includes the following steps.

Figure 10:
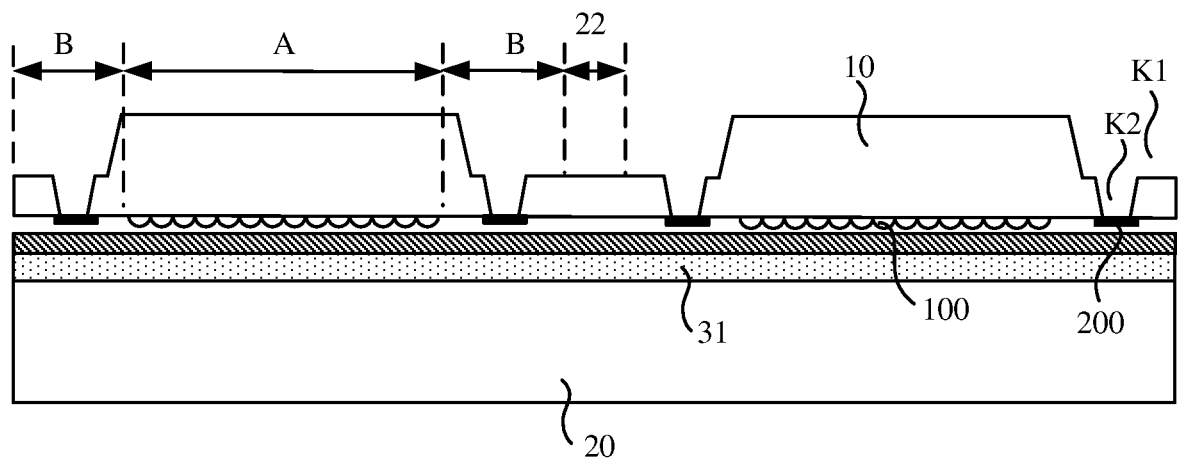

First, a via hole penetrating the wafer is formed on a second surface of each chip to be packaged, and the via hole is configured to expose the first contact pad. The forming of the package shown in FIG. 1 is taken as an example for description. In this case, as shown in FIG. 10, the process of forming the via hole penetrating the wafer on the second surface of each of the chips to be packaged includes: forming a double-stepped hole configured to expose the first contact pad on the second surface of the chip to be packaged 10. In this case, each of the via holes includes a groove K1 provided on the second surface of the chip to be packaged 10 and a through hole K2 located in the groove K1 and penetrating the chip to be packaged 10. A depth of the groove K1 is smaller than a thickness of the chip to be packaged 10 and the groove K1 does not penetrate the chip to be packaged 10. A through hole K2 is formed on the basis of the groove K1, and the through hole K2 penetrates the chip to be packaged 10 to expose the first contact pad 200. There is a one-to-one correspondence between the through holes K2 and the first contact pads 200, and the through hole K2 is configured to expose the corresponding first contact pad 200.

Figure 11:
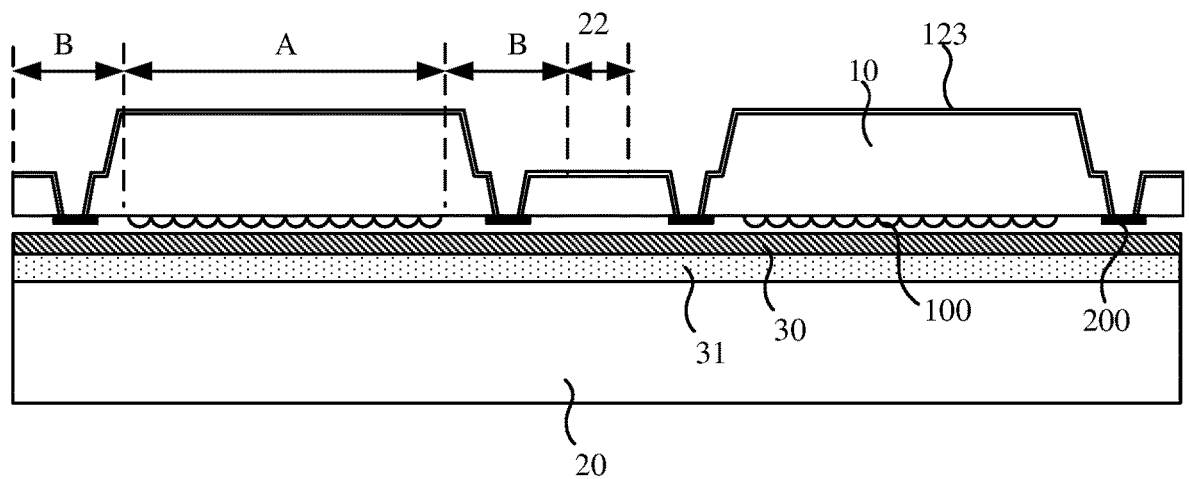

Further, as shown in FIG. 11, an insulating layer 123 covering the second surface of the chip to be packaged 10 and the sidewall of the via hole is formed, and the insulating layer 123 is configured to expose the first contact pad 200.

Figure 12:
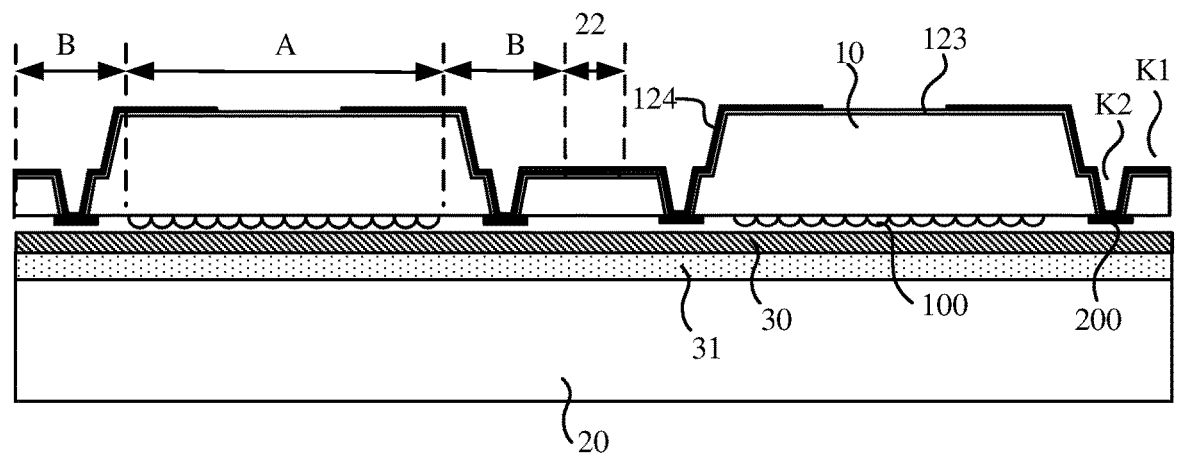

Further, as shown in FIG. 12, a rewiring layer 124 covering a bottom of the via hole and the insulating layer 123 is formed.

Figure 13:
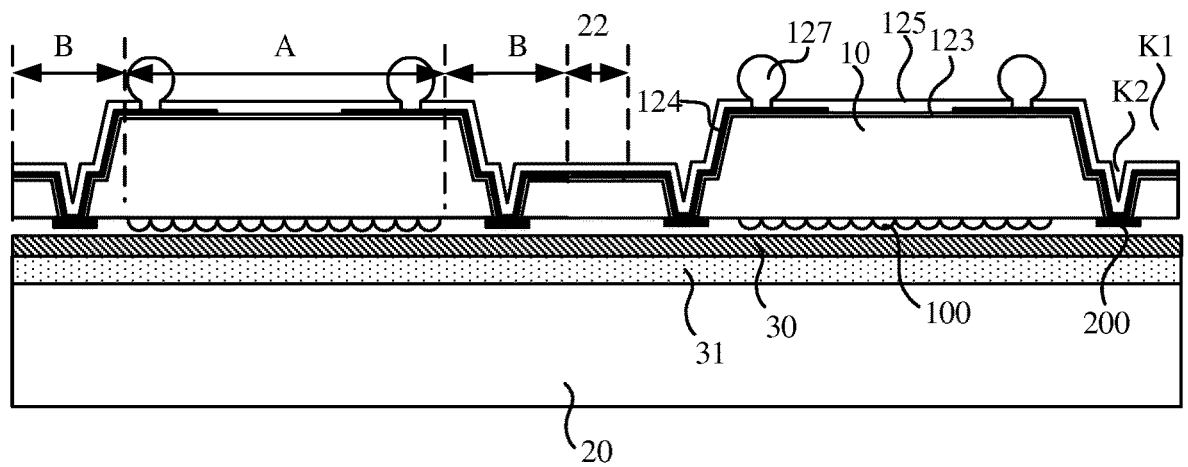

Finally, as shown in FIG. 13, the solder bumps 127 is formed on the surface of the rewiring layer 124, and the solder bumps 127 are provided opposite to the sensing region of the chip to be packaged 10. Before the solder bump 127 is formed, a solder mask 125 covering the rewiring layer 124 is formed. The solder mask 125 includes an opening configured to expose a portion of the rewiring layer 124, and the solder bump 127 is formed at the opening.

Figure 14A:
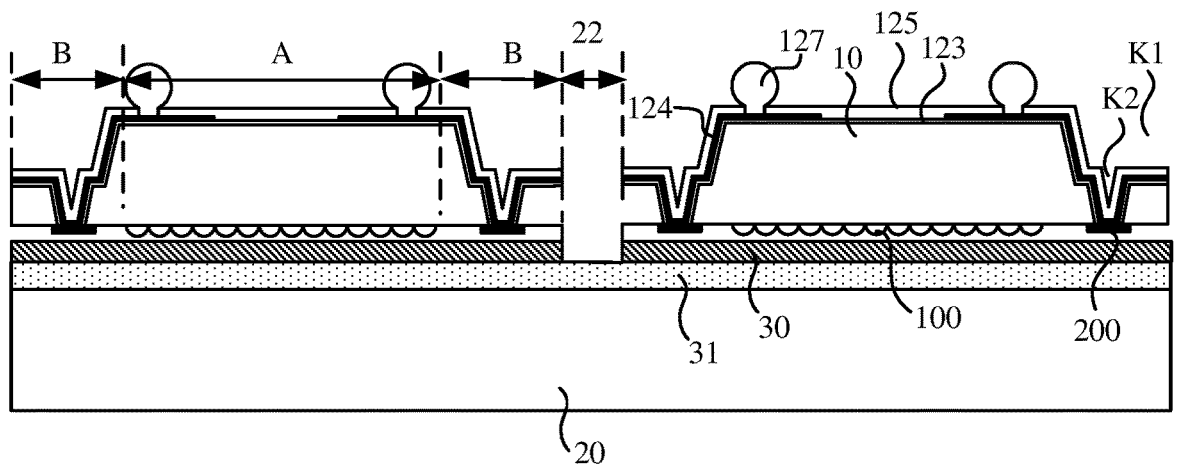

In step S15, as shown in FIG. 14a, the wafer and the reinforcing layer are cut along a cutting trench 22 of the wafer with a cutting process to form packages of the multiple chips to be packaged.

Figure 14B:
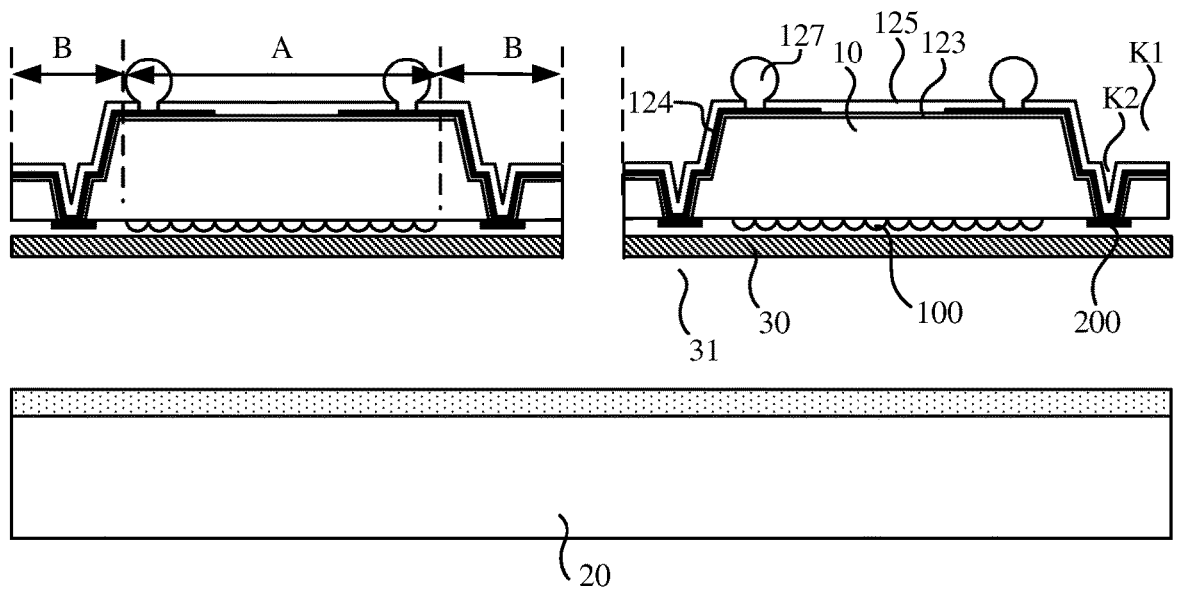

In step S16, as shown in FIG. 14b, the protection substrate 20 is peeled off.

For the embodiment shown in FIG. 10 to FIG. 14b, the package as shown in FIG. 1 is finally formed.

In other embodiments, the process of forming the via hole penetrating the wafer on the second surface of each of the chips to be packaged includes: forming an inverted trapezoid hole configured to expose the first contact pad on the second surface of the chip to be packaged. An aperture of the via hole gradually increases in a direction from the first surface to the second surface. The via hole may be a truncated cone or a frustum of a prism. In this case, the package shown in FIG. 2 is formed with the cutting process.

In other embodiments, the process of forming the via hole penetrating the wafer on the second surface of each of the chips to be packaged includes: forming a straight hole configured to expose the first contact pad on the second surface of the chip to be packaged. An aperture of the via hole remains unchanged in a direction from the first surface to the second surface. The via hole may be a round hole, a triangular hole, a square hole or the like. In this case, the package shown in FIG. 3 is formed with the cutting process.

In the embodiment shown in FIG. 10 to FIG. 14, the solder bump 127 is electrically connected to the first contact pad 200 by a via hole penetrating the chip to be packaged 10. In other embodiments, the solder bump 127 is electrically connected to the first contact pad 200 due to an inclined cutting plane. In this case, in step S14, the process of forming a solder bump on the other surface of the wafer includes the following steps.

Figure 15:
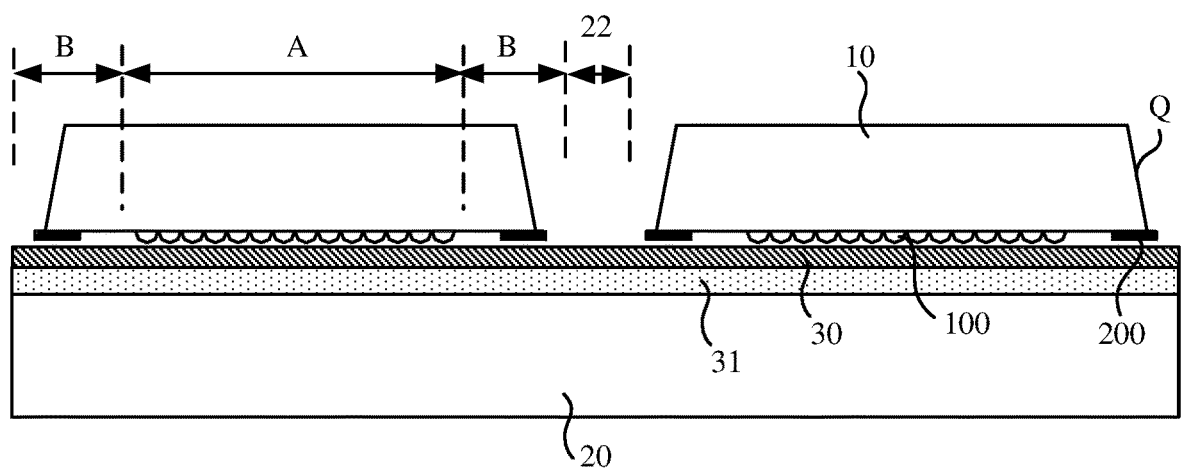
FIG. 15 to FIG. 18 are schematic diagrams showing a process principle of another packaging method according to an embodiment of the present disclosure.

First, as shown in FIG. 15, after the reinforcing layer 30 is laminated and fixed to the protection substrate 20, an inclined cutting plane Q is formed on a sidewall of the chip to be packaged 10, the second surface is smaller than the first surface due to the inclined cutting plane Q, to expose the first contact pad 200.

Figure 16:
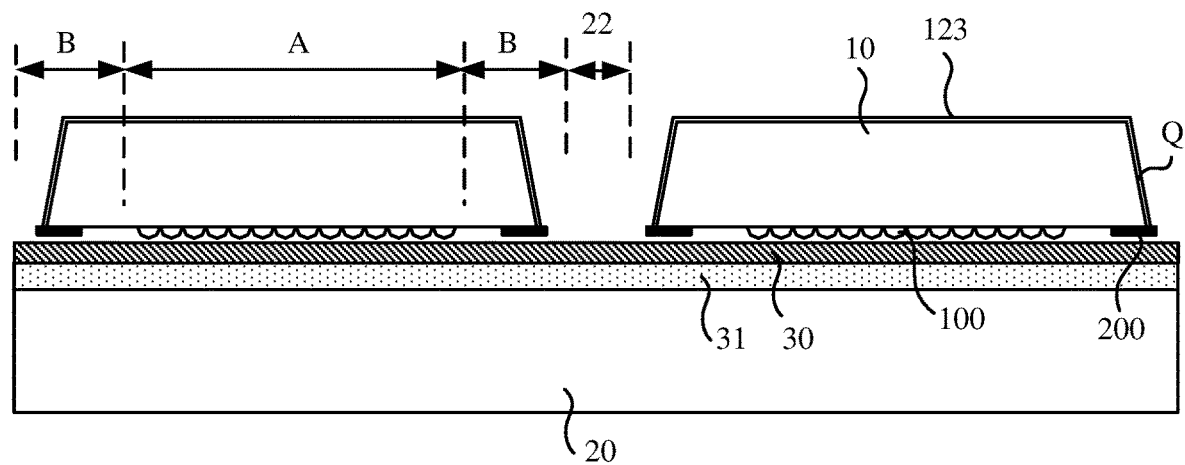

Then, as shown in FIG. 16, an insulating layer 123 covering the inclined cutting plane Q and the second surface of the chip to be packaged 10 is formed, and the insulating layer 123 is configured to expose the first contact pad 200.

Figure 17:
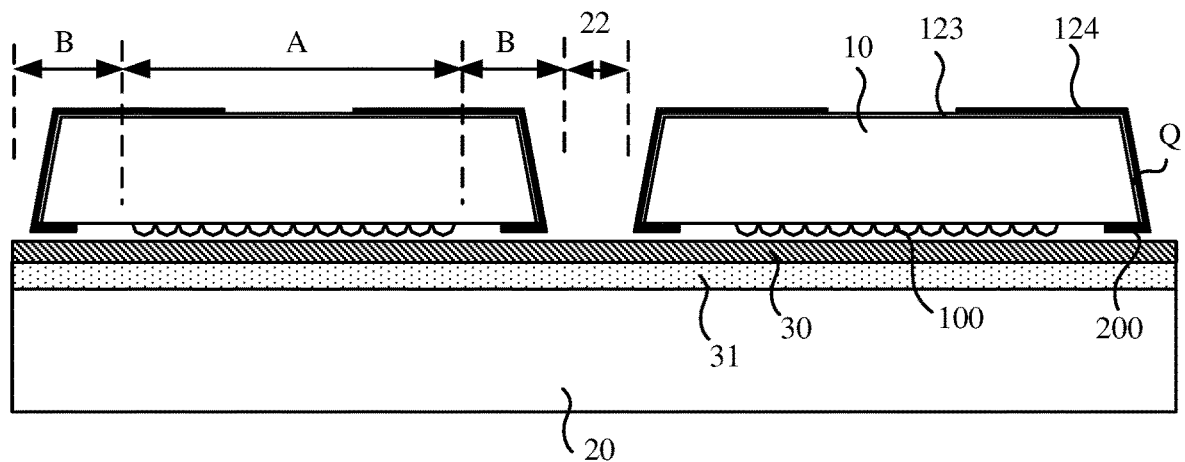

Further, as shown in FIG. 17, a rewiring layer 124 covering the first contact pads 200 and the insulating layer 123 is formed.

Figure 18:
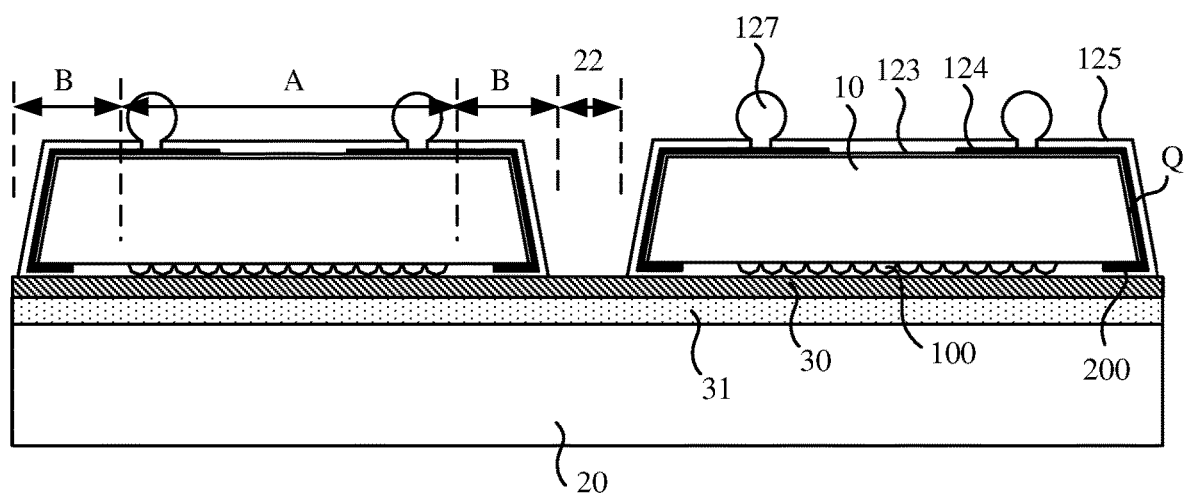

Finally, as shown in FIG. 18, the solder bumps 127 are formed on the surface of the rewiring layer 124, and the solder bumps 127 are provided opposite to the sensing region A of the chip to be packaged 10. Similarly, before the solder bump 127 is formed, a solder mask 125 covering the rewiring layer 124 is formed. The solder mask 125 includes an opening configured to expose a portion of the rewiring layer 124. The solder bump 127 is formed at the opening. The reinforcing layer 30 is cut along the cutting trench. The package as shown in FIG. 4 is formed with the cutting process.

In order to further enhance the mechanical strength of the package, the packaging method according to the embodiment of the present disclosure further includes: forming a strengthening layer on a side of the wafer facing away from the reinforcing layer. Specifically, the strengthening layer may be located between the chip to be packaged and the insulating layer, or cover the solder mask and is located on an outer surface of the package.

It can be seen from the above description that the package described in the above-described embodiment can be formed with the packaging method according to the embodiment of the present disclosure, the packaging process is simple, the manufacturing cost is low, and the formed package has strong mechanical strength.

The embodiments in the present specification are described in a progressive manner. Each embodiment focuses on differences from other embodiments, and for the same or similar parts among the embodiments, one may refer to description of other embodiments. For the packaging method disclosed in the embodiment, since the packaging method corresponds to the package disclosed in the embodiment, the packaging method is described simply. For the relevant part, reference may be made to the corresponding part of the package.

The above description of the disclosed embodiments enables those skilled in the art to implement or use the disclosure. Various modifications to these embodiments are readily apparent to those skilled in the art, and the general principles defined herein may be embodied in other embodiments without departing from the spirit or scope of the disclosure. Therefore, the present disclosure should not be limited to these embodiments shown herein, but rather should be in accordance with the broadest scope consistent with the principles and novel features disclosed herein.

The invention claimed is:

1. A chip package, comprising:
    a chip to be packaged, wherein the chip to be packaged comprises a first surface and a second surface opposite to each other, the first surface comprises a sensing region and first contact pads, and the first contact pads are electrically coupled to the sensing region;
    a reinforcing layer covering the first surface of the chip to be packaged; and
    solder bumps provided on the second surface of the chip to be packaged, wherein the solder bump is electrically connected to the first contact pad and is configured to electrically connect with an external circuit,
    wherein a thickness of the reinforcing layer ranges from 2 µm to 40 µm, inclusive.

2. The chip package according to claim 1, wherein hardness of the reinforcing layer is greater than 6H representing a value of pencil hardness.

3. The chip package according to claim 1, wherein the reinforcing layer is made of an organic material or an inorganic material.

4. The chip package according to claim 1, wherein the chip to be packaged is a capacitive sensing chip, a dielectric constant of the reinforcing layer is greater than 3, and the reinforcing layer is made of an insulating material.

5. The chip package according to claim 1, wherein the chip to be packaged is a photosensitive chip, and the reinforcing layer is made of a transparent material.

6. The chip package according to claim 5, wherein a light transmittance of the reinforcing layer is greater than 80%.

7. The chip package according to claim 1, further comprising: a strengthening layer provided on a side of the chip to be packaged facing away from the reinforcing layer, wherein the strengthening layer is located on the outermost side of the package.

8. The chip package according to claim 7, wherein the strengthening layer is made of a plastic packaging adhesive.

9. The chip package according to claim 1, wherein the second surface of the chip to be packaged is provided with via holes penetrating the chip to be packaged, the via hole is configured to expose the first contact pad; and
    the solder bump is electrically connected to the first contact pad through a rewiring layer provided in the via holes.

10. The chip package according to claim 9, wherein the via hole is a double-stepped hole configured to expose the first contact pad; and
    each of the via holes comprises: a groove provided on the second surface of the chip to be packaged, wherein a depth of the groove is less than a thickness of the chip to be packaged; and a through hole located in the groove and penetrating the chip to be packaged, wherein there is a one-to-one correspondence between the through holes and the first contact pads, and the through hole is configured to expose the corresponding first contact pad.

11. The chip package according to claim 9, wherein the via hole is an inverted trapezoid hole configured to expose the first contact pad; and
    an aperture of the via hole gradually increases in a direction from the first surface to the second surface.

12. The chip package according to claim 9, wherein the via hole is a straight hole configured to expose the first contact pad.

13. The chip package according to claim 1, wherein a sidewall of the chip to be packaged comprises an inclined cutting plane, the second surface is smaller than the first surface due to the inclined cutting plane, to expose a portion of the first contact pad; and
    the solder bump is electrically connected to the first contact pad through a rewiring layer provided on the inclined cutting plane.

* * * * *